United States Patent [19]

Asano et al.

[11] Patent Number: 5,055,036
[45] Date of Patent: Oct. 8, 1991

[54] METHOD OF LOADING AND UNLOADING WAFER BOAT

[75] Inventors: Takanobu Asano, Yokohama; Hiroyuki Iwai; Yuji Ono, both of Sagamihara, all of Japan

[73] Assignee: Tokyo Electron Sagami Limited, Kanagawa, Japan

[21] Appl. No.: 661,103

[22] Filed: Feb. 26, 1991

[51] Int. Cl.$^5$ ............................................... F27D 3/00
[52] U.S. Cl. ........................................... 432/5; 432/6; 432/241; 432/123
[58] Field of Search ..................... 432/5, 6, 123, 124, 432/125, 241

[56] References Cited

U.S. PATENT DOCUMENTS

| | | | |
|---|---|---|---|
| 4,610,628 | 9/1986 | Mizushina | 432/6 |
| 4,954,079 | 9/1990 | Yamaga | 432/6 |
| 4,955,808 | 9/1990 | Miyagawa | 432/5 |
| 4,976,613 | 12/1990 | Watanabe | 432/241 |
| 5,009,590 | 4/1991 | Mitarai et al. | 432/6 |

FOREIGN PATENT DOCUMENTS 61-291335  12/1986  Japan .
63-244856  10/1988  Japan .

Primary Examiner—Henry C. Yuen
Attorney, Agent, or Firm—Oblon, Spivak, McClelland, Maier & Neustadt

[57] ABSTRACT

A wafer boats supporting wafers is loaded into and unloaded from a reaction tube with a lid therebelow in a vertical heat treatment apparatus, while holding the wafer boat vertical with respect to the lid. An arm is provided in a space below the reaction tube, for transferring wafer boats along a path, while holding the wafer boats vertical and in a substantially horizontal plane. Three stations are formed in the path. At the first station, unprocessed wafers are mounted on a first wafer boat located, while wafers mounted on a first wafer boat is being heat-treated in said reaction tube. Then, the first wafer boat is transferred from the first station to the third station, and is held at the third station. While the first wafer boat is held at the third station, the second wafer boat is lowered to the second station to unload the second wafer boat from the reaction tube, and then is transferred to the first station. Thereafter, the heat-treated wafers are removed from the second wafer boat located at the first station. Next, the first wafer boat is transferred from the third station to the second station, while the second wafer boat is located at the first station, and then is mounted onto the lid, thereby to load the first wafer boat into the reaction tube.

7 Claims, 15 Drawing Sheets

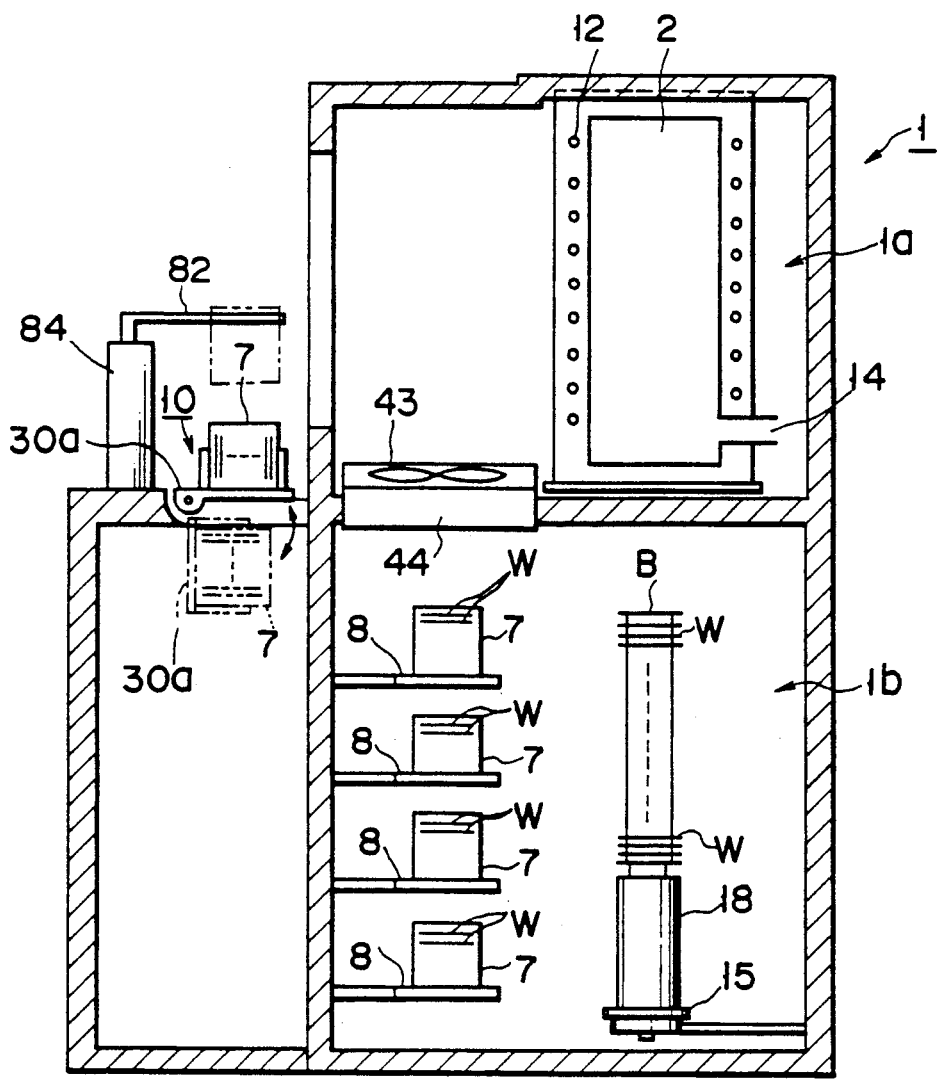
F I G. 1

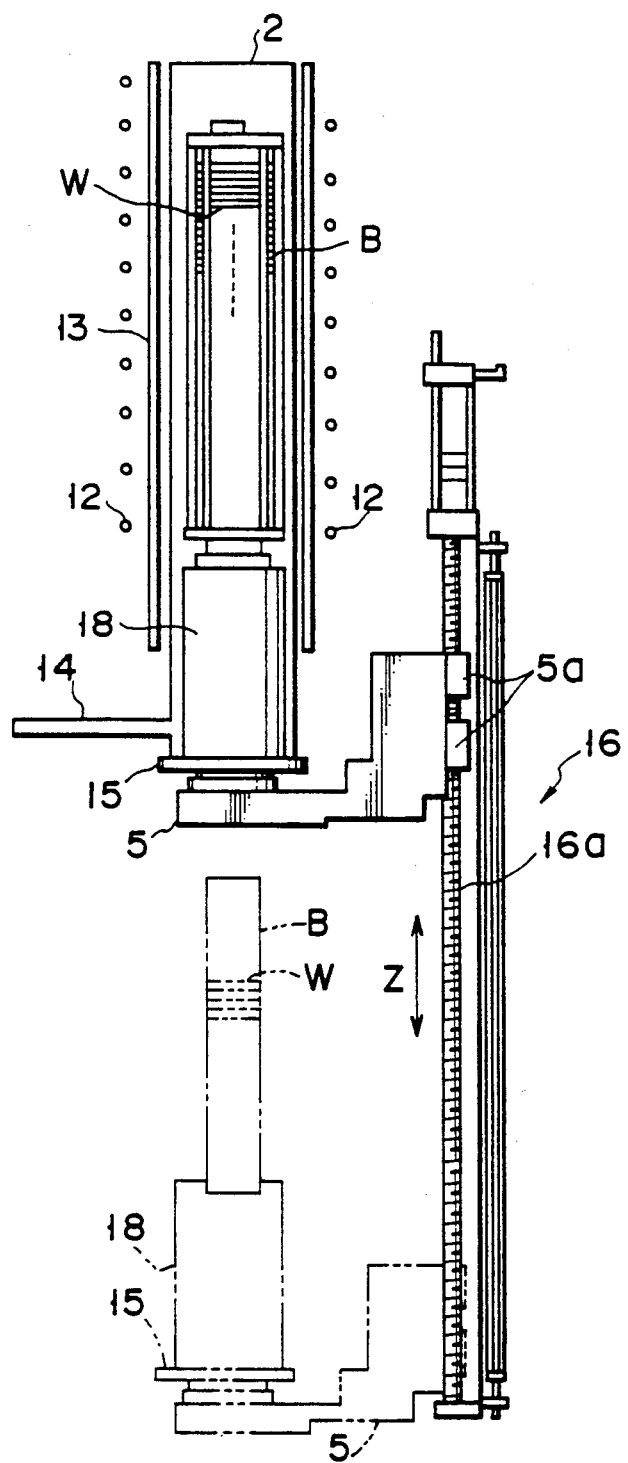
F I G. 2

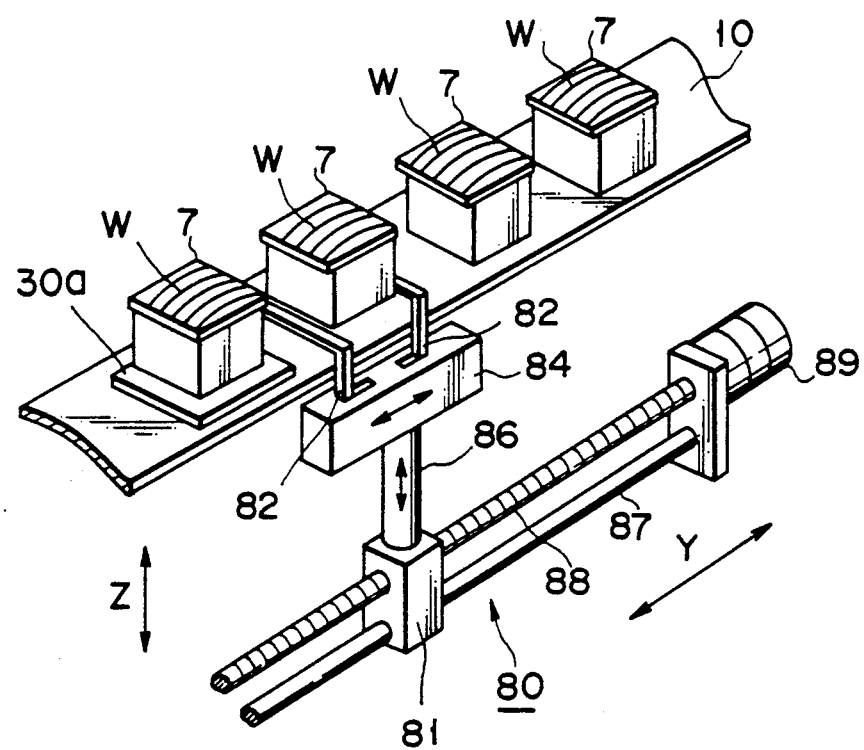
F I G. 4

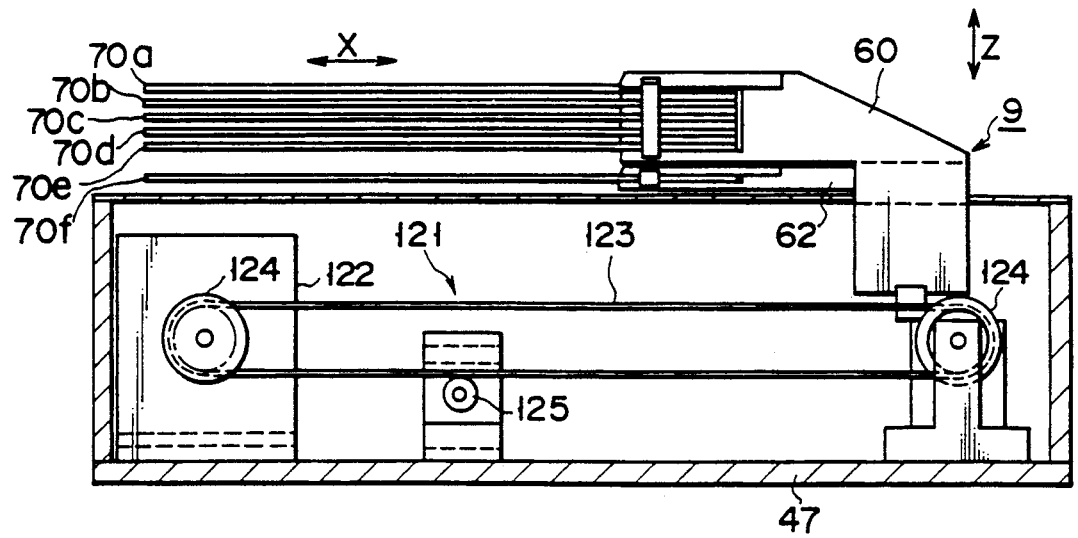
F I G. 8
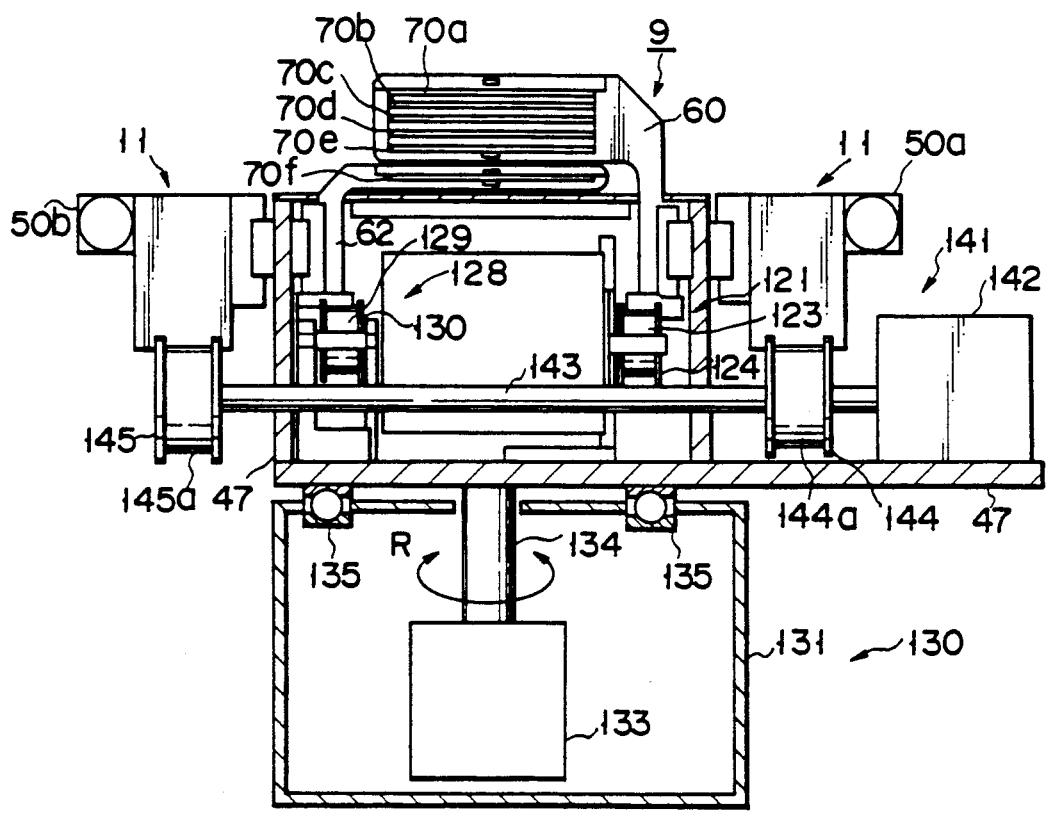
F I G. 9

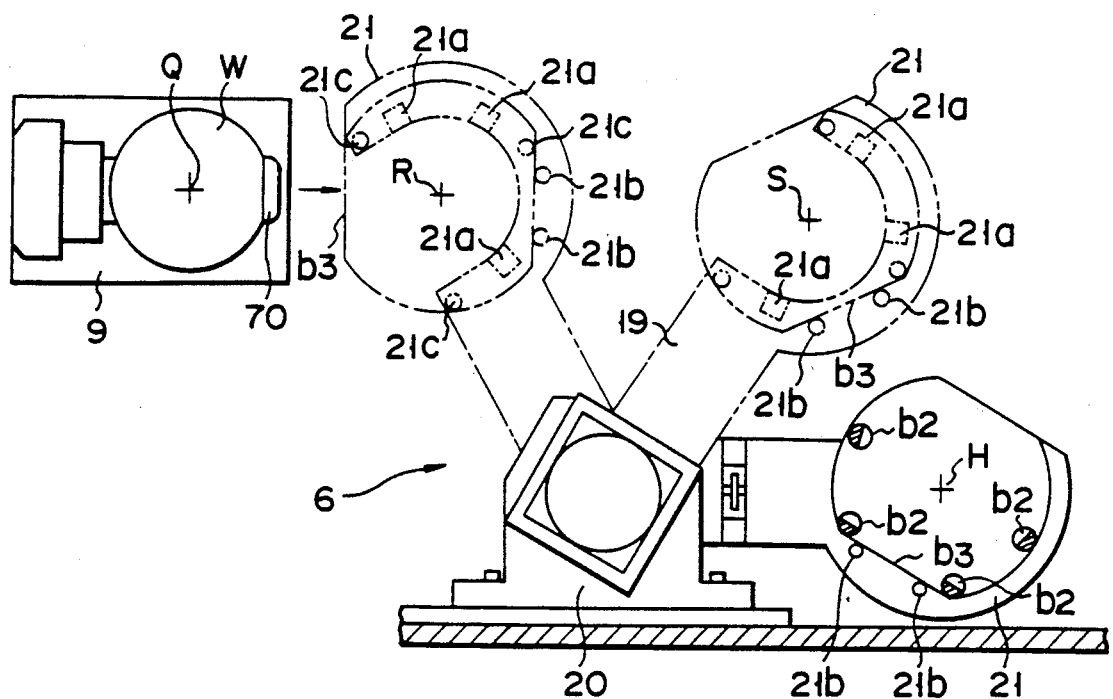
F I G. 12
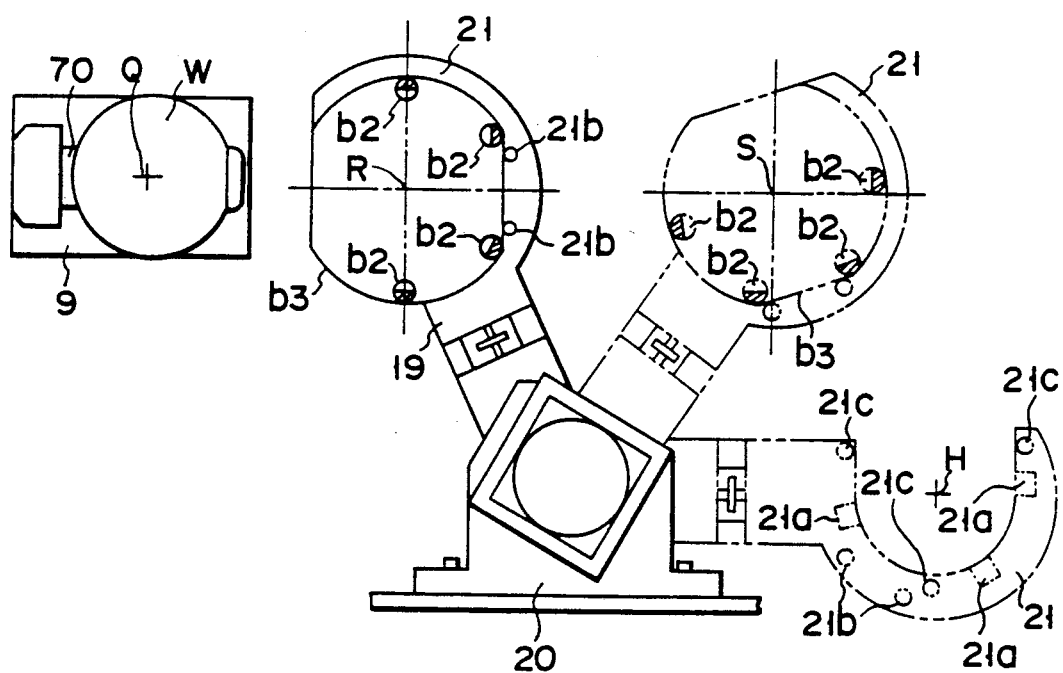
F I G. 13

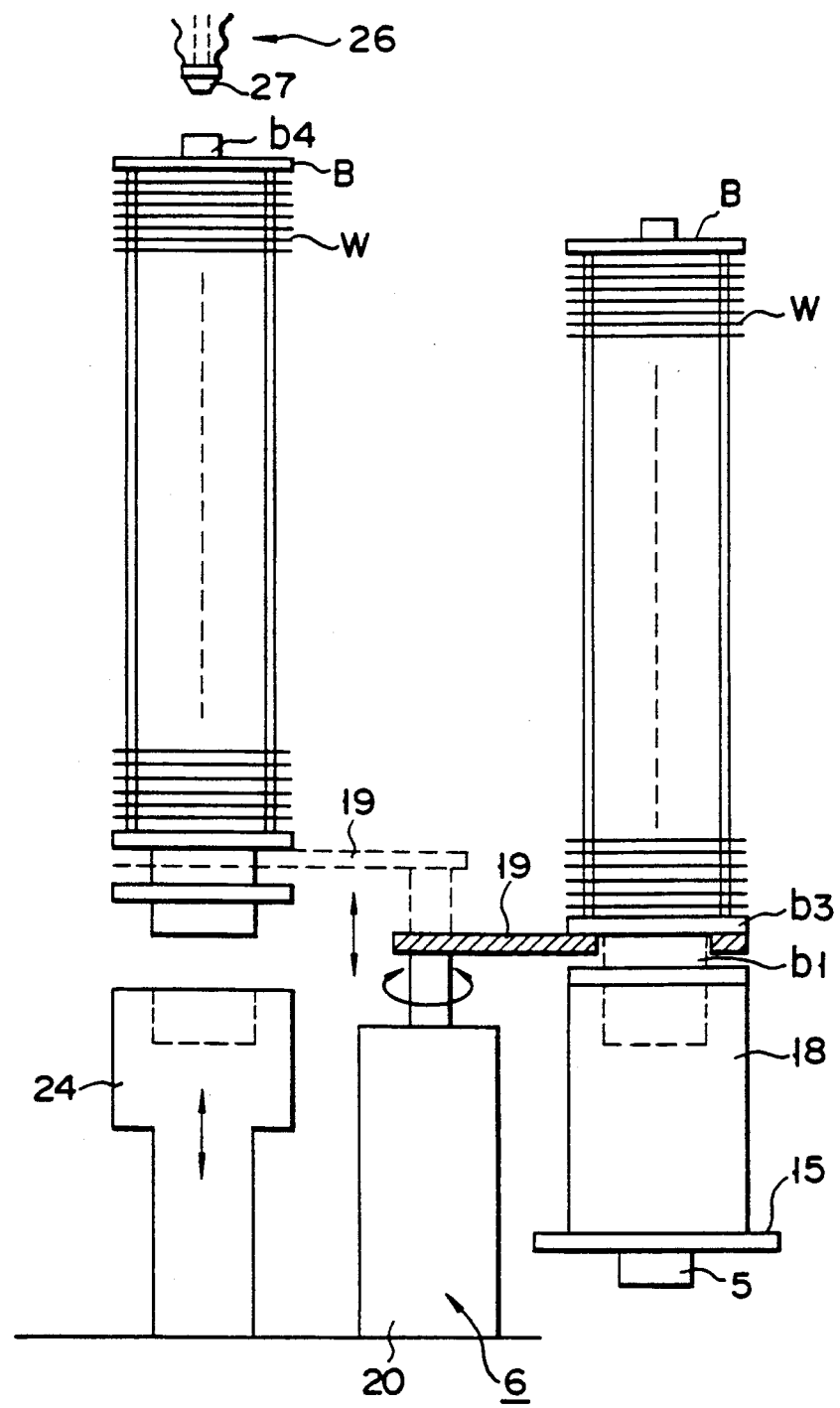
F I G. 14

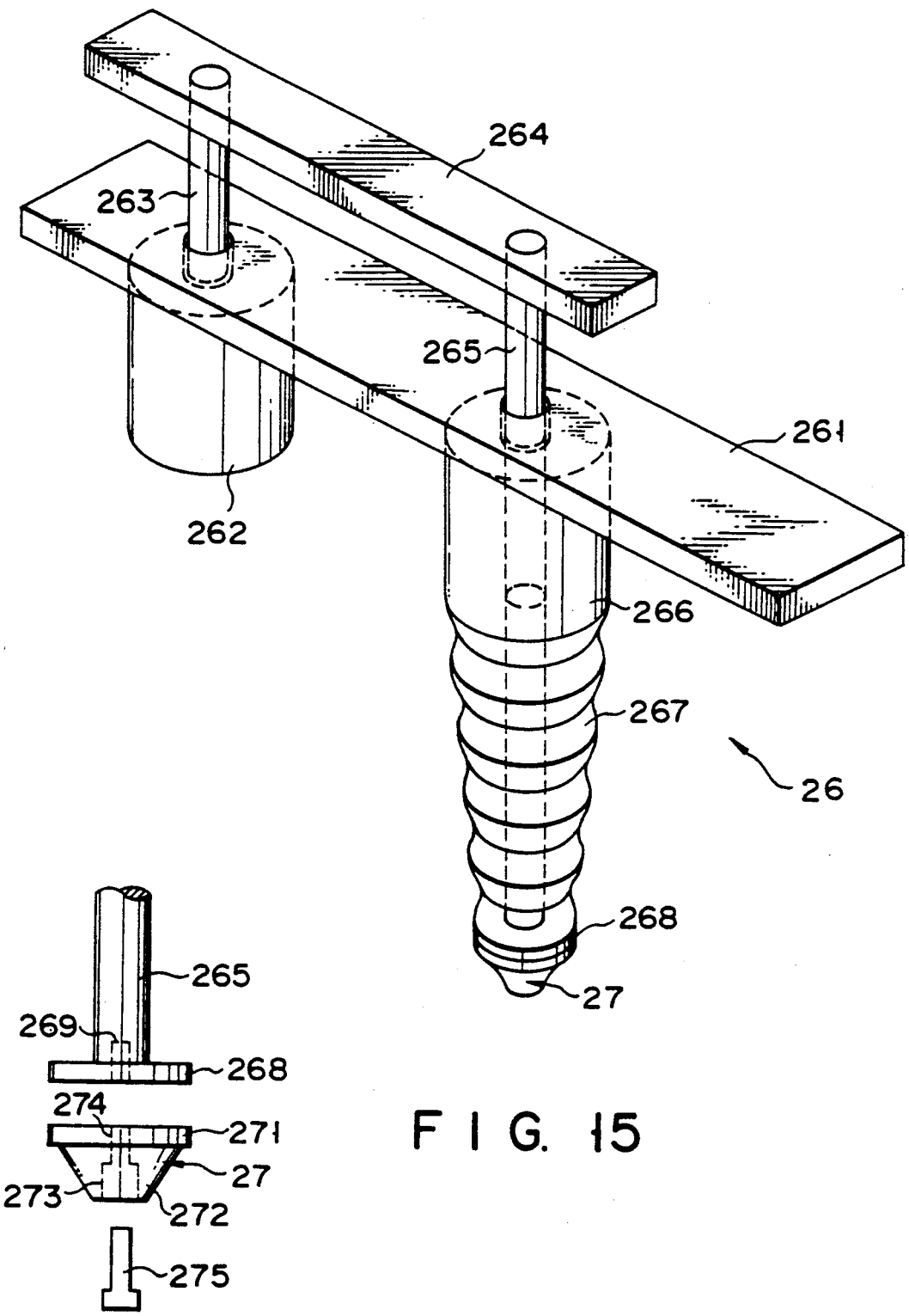
F I G. 15
F I G. 16

5,055,036

METHOD OF LOADING AND UNLOADING WAFER BOAT

BACKGROUND OF THE INVENTION

1. Field of the Invention

The present invention relates to a method for operating a vertical heat-treatment apparatus and more particularly to a method of transferring boats, each of which carries a lot of wafers, between a wafer transfer position and a boat load/unload position.

2. Description of the Related Art

As unmanned control system and automation system have recently developed in a clean room, there has been visualized a system for transferring wafer carriers (cassettes) by means of pilotless transferring robots between machines for manufacturing semiconductor devices. For this purpose, a loading/unloading port for automatically transferring wafer carriers is provided in each manufacturing machine.

It is required that the space of the clean room be as small as possible in order to exhaust duct in the clean room in a short time so as to maintain a high degree of cleanness. Since a vertical heat-treatment furnace has a smaller floor space than a horizontal heat-treatment furnace, the employment of the vertical heat-treatment furnace allows for effective usage of the floor space. Further, the vertical heat-treatment furnace has an advantage that a wafer boat is transferred without contacting the inner wall of a reaction tube.

In the vertical heat-treatment furnace is provided a wafer transfer device for transferring semiconductor wafers from the carriers to the boat.

U.S. Pat. No. 4,770,590 discloses a wafer transfer mechanism for a vertical heat-treatment furnace. However, this wafer transfer mechanism is of a semiautomatic type so that an operator must manually set carriers on the station. At the time of this setting, undesirable dust enters the furnace and semiconductor wafers are contaminated, as a result increasing the fraction defective of the semiconductor devices.

SUMMARY OF THE INVENTION

An object of the present invention is therefore to provide a method of loading and unloading a wafer boat supporting wafers, in a vertical heat treatment apparatus having a boat transfer mechanism suitable for making the introduction, treatment and discharge processes of wafers automatic.

Another object of the present invention is to provide a method for operating a vertical heat treatment apparatus having a boat transfer mechanism which is capable of reliably positioning the boat opposite to a wafer transfer system when wafers are transferred from carriers to the boat.

A further object of the present invention is to provide a method for operating a heat treatment apparatus which is capable of enhancing the stability of the boat to reliably and stably transfer the wafers from the carriers to the boat.

A still further object of the present invention is to provide a method for operating a heat treatment apparatus not wasting the waiting time of the boat as a loss when the wafers are transferred from the carriers of the boat.

These and other objects of the present invention can be achieved by a method of loading a wafer boat supporting wafers into and unloading the same from a reaction tube with a lid therebelow in a vertical heat treatment apparatus, while holding the wafer boat vertical with respect to the lid, said method comprising the steps of: providing boat transfer means in a space below the reaction tube, said boat transfer means being designed to transfer wafer boats along a path, while holding the wafer boats vertical and in a substantially horizontal plane; forming, along the path, a first station where wafers are to be placed onto and removed from the wafer boats held vertical, a second station where wafer boats are to be placed onto and removed from the lid, and a third station where wafer boats are to be held; mounting unprocessed wafers on a first wafer boat located at the first station, while wafers mounted on a second wafer boat is being heat-treated in said reaction tube; transferring the first wafer boat from the first station to the third station by means of the boat transfer means, and then holding the first wafer boat at the third station; lowering the second wafer boat to the second station to unload the second wafer boat from the reaction tube, while the first wafer boat is held at the third station, and then transferring the second wafer boat to the first station by means of the boat transfer means; removing the heat-treated wafers from the second wafer boat located at the first station; and transferring the first wafer boat from the third station to the second station by means of the boat transfer means, while the second wafer boat is located at the first station, and then mounting the first wafer boat onto the lid, thereby to load the first wafer boat into the reaction tube.

According to a method of the present invention, the boat transfer means can position the boat, so that the transfer of wafers to and out of the boat by the wafer transfer means can be made automatic. The top of the boat can be supported at the wafer transferring time. Therefore, the vibration of the boat can be prevented to thereby carry out the wafer transfer operation with higher reliability. To add the boat waiting system, it enables the transfer of wafers and the load and unload of the boat to be carried out at the same time, so that the time needed to transfer the wafers to and out of the boat by the wafer transfer means can be more effectively used.

The present invention can be applied to oxidation diffusion, CVD and other processes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a longitudinal cross-sectional view of an overall vertical heat-treatment apparatus according to an embodiment of the present invention;

FIG. 2 is a partial transversal cross-sectional view of the main part of the vertical heat-treatment apparatus of FIG. 1;

FIG. 4 is a perspective view of a mechanism for carrying out the parallel transfer of carriers;

FIG. 8 is a longitudinal cross-sectional view of a wafer loading/unloading mechanism;

FIG. 9 is a transversal cross-sectional view of the wafer loading/unloading mechanism;

FIGS. 12 and 13 are plane views of an arm showing a rotation manner thereof and positioning members thereof;

FIG. 14 is an elevation view showing the relation of a boat relative to the arm at those positions where wafers are transferred to and out of the boat and the boat is loaded and unloaded;

FIG. 15 is a perspective view showing a support system for holding the top of the boat; and FIG. 16 is a side view showing an engaging member and its components of the support system dismantled.

DETAILED DESCRIPTION OF THE PREFERRED EMBODIMENTS

Figure 3:
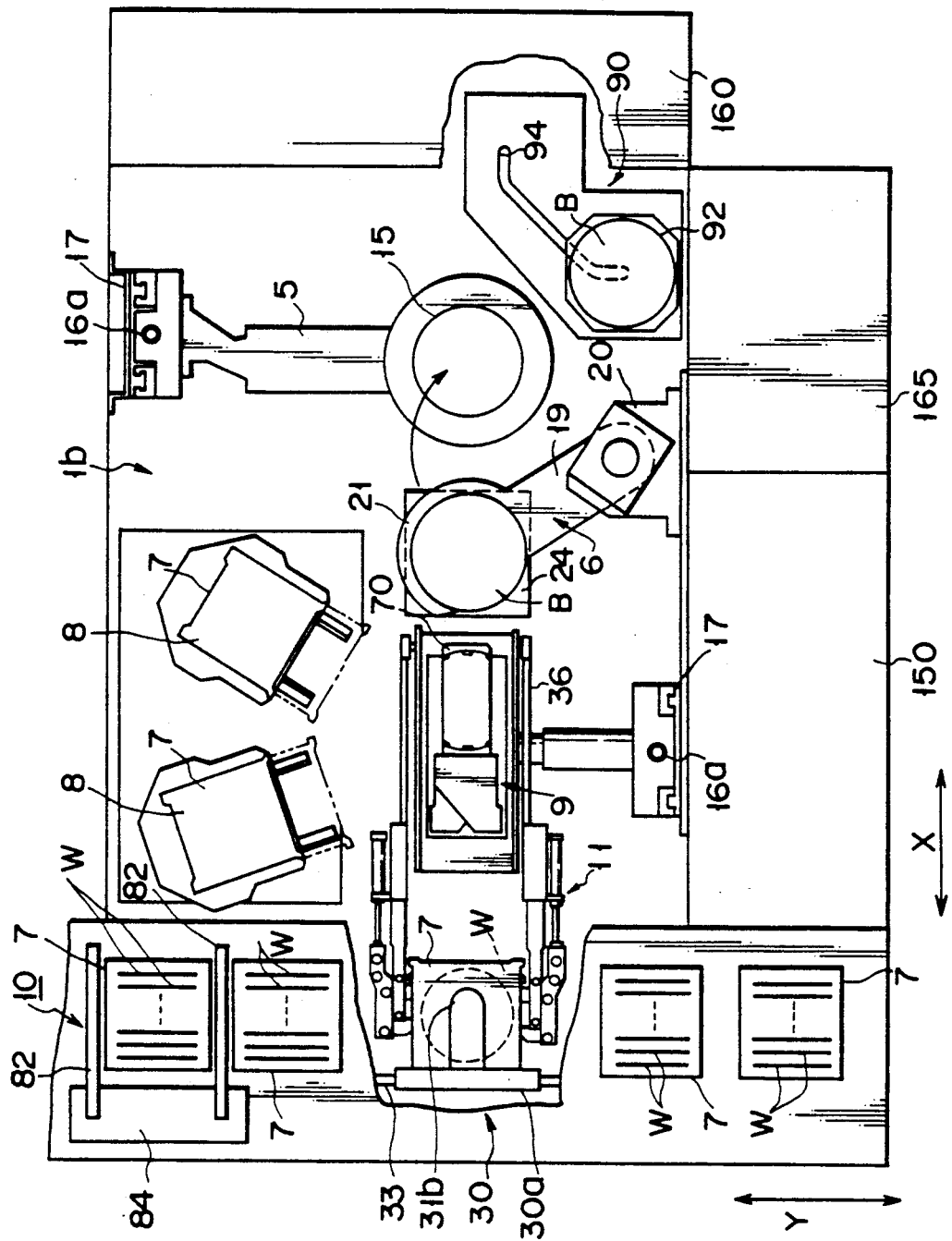
FIG. 3 is a plan view of a wafer transfer device in the lower portion of the apparatus.
Figure 5A:
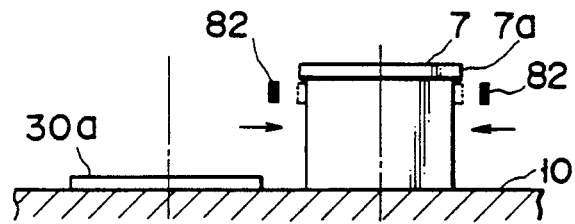
FIGS. 5A to 5D show the movements of a carrier when the carrier on a stage is transferred to a carrier port by means of the mechanism for carrying out the parallel transfer of carriers.
Figure 5B:
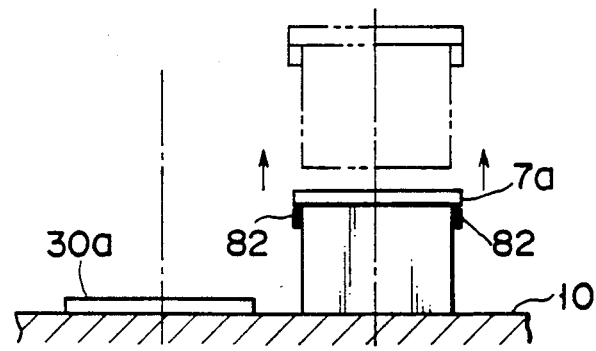
Figure 5C:
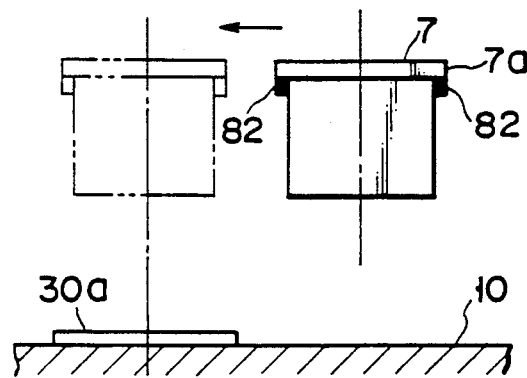
Figure 5D:
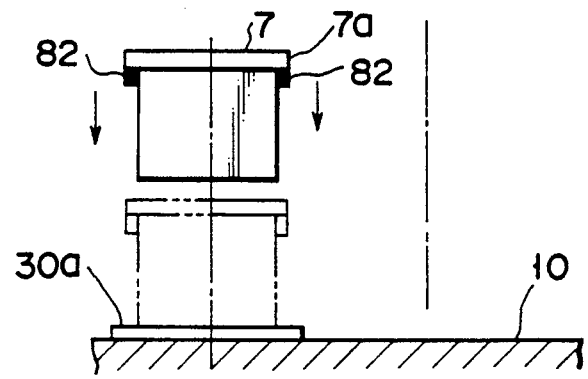

A vertical heat-treatment apparatus 1 is installed in an unmanned clean room and is fully automatically controlled by a computer system.

As shown in FIG. 1, the vertical heat-treatment apparatus 1 comprises a process section 1a and a wafer transfer section 1b. The process section 1a comprises the upper portion of the apparatus 1. and the wafer transfer section 1b comprises the lower portion of the apparatus 1. A fan 43 having a filter 44 is provided between the process section 1a and the wafer transfer section 1b. The fan 43 is disposed right above a carrier station 8 in the wafer transfer section 1b and supplies clean air to the station 8 at least when wafers W are transferred so that the wafer is protected from adhering dust. As the filter 44, an HEPA filter or a ULPA filter is used.

Referring to FIG. 3, a carrier port 10, a process control section 150, a process gas supplying section 165 and an evacuating section 160 are provided adjacent to the wafer transfer section 1b. The carrier port 10 is provided on the front face of the wafer transfer section 1b and extends along a Y axis. A plurality of carriers 7 are arranged at equal intervals on the carrier port 10. The movable base 30a of a carrier posture change mechanism 30 is supported on the central portion of the port 10 by means of a horizontal support shaft 33. A parallel transfer mechanism 80 (shown in FIG. 4) is mounted on the front face of the wafer transfer section 1b.

Figure 6A:
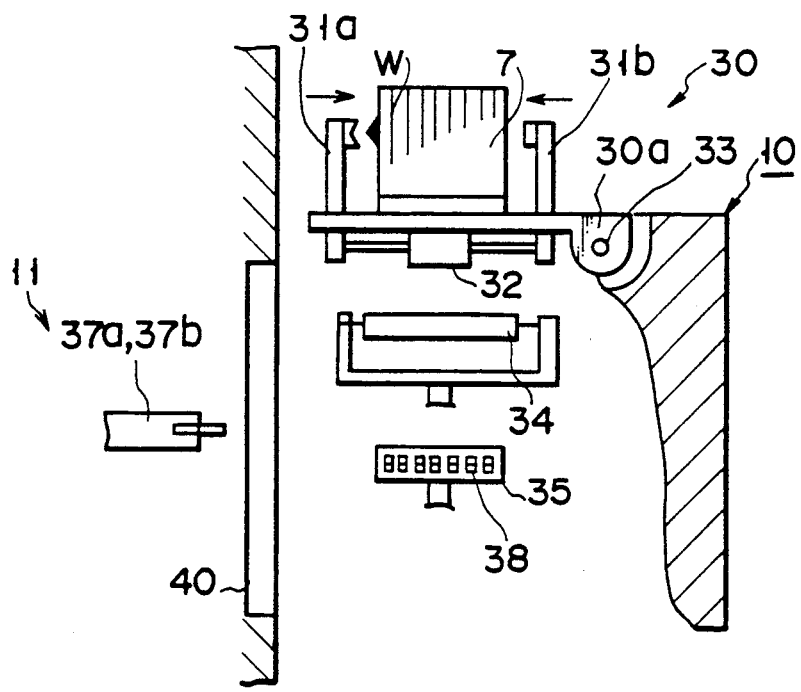
FIGS. 6A to 6C show the operation of a carrier posture change mechanism and a carrier receiving mechanism when the carrier is transferred from the carrier port to the lower portion of the apparatus.
Figure 6B:
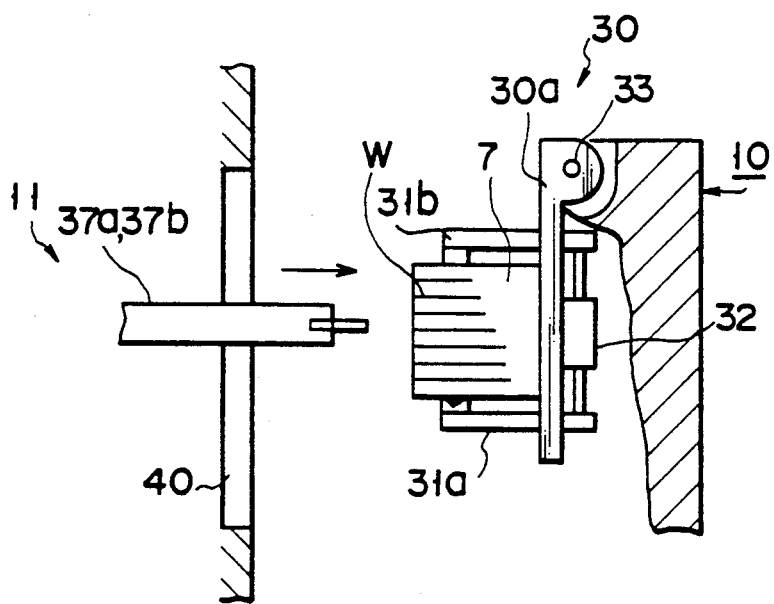
Figure 6C:
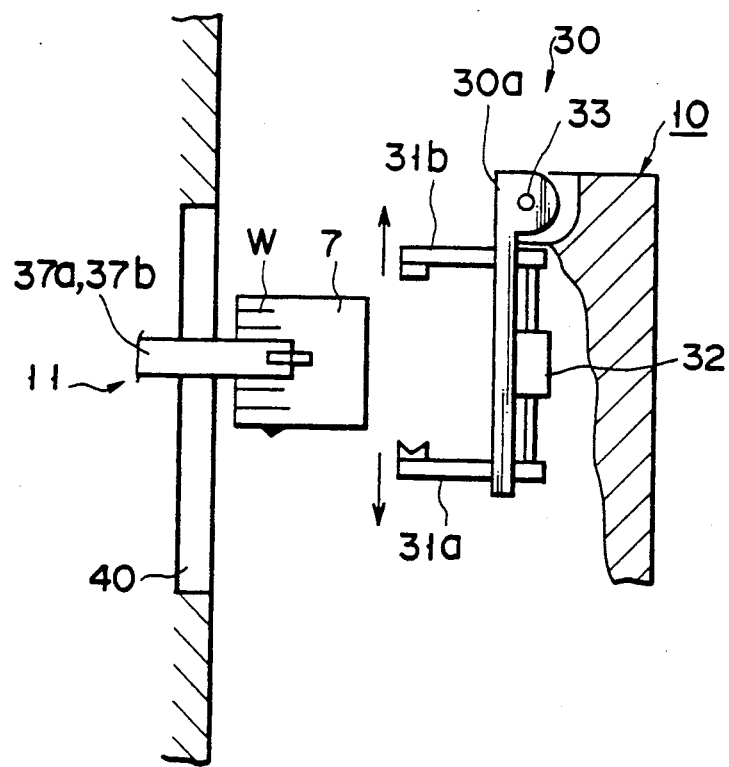

As shown in FIGS. 6A to 6C, the port 10 is formed an opening so that the movable base 30a can be rotated about the shaft 33 between the horizontal state and the vertical state at the opening of the port 10.

In the process section 1a is formed a process tube 2 wounded by a coil heater 12. The upper end of the tube 2 is closed and the lower end thereof is opened. The lower opening of the tube 2 communicates with the wafer transfer section 1b.

In FIG. 2, a lid member 15 is disposed right under the lower opening of the process tube 2. On the lid member 15 is placed a heat insulating cylindrical member 18 on which a vertical quartz boat B is disposed to set a stack of wafers in an uniformly heating zone. The lid member 15 is carried by a support member 5, and nuts 5a of the support member 5 mesh with the ball screw 16a, for example, of a lift mechanism 16. The ball screw 16a is started and stopped by a rotary motor controlled under a program stored in a computer (not shown). The ball screw 16a is covered by an appropriate member to prevent generating dust from being scattered. The lid member 15 has a larger diameter than the lower opening of the process tube 2.

A process gas supplying tube (not shown) extends vertically along the inner peripheral wall of the tube 2 and is connected to a gas supplying source (not shown) via a mass-flow controller (not shown). An air exhaust tube 14 extends from the lower portion of the tube 2 and is connected to the suction port of a vacuum pump (not shown). Between the process tube 2 and the coil heater 12 is disposed a heat equalizing tube 13 for rendering the temperature distribution in the tube 2 uniform.

The parallel transfer mechanism 8 will now be explained with reference to FIG. 4.

A truck (not shown) on which a robot runs is laid in front of the carrier port 10. The robot (not shown) transports carriers 7 to the port 10 and loads them thereon. The parallel transfer mechanism 80 is provided on the front face of the carrier port 10 and has a ball screw 88 and a linear guide 87 extending along the Y axis so as to pass through a movable member 81. One end of the ball screw 88 is connected to the driving shaft of a motor 89.

The movable member 81 contains a nut and a lift cylinder (neither shown), and the nut meshes with the ball screw 88. To the upper end portion of the cylinder rod 86 of the lift cylinder is fixed a chuck mechanism 84 which has a pair of arms 82 connected to the rod (not shown) of an air cylinder. The air cylinder for driving the arms 82 is provided along the Y axis. The mechanism 80 is covered by a suitable member (not shown) to prevent generating dust from being scattered.

Referring to FIGS. 6A to 6C, there will now be explained the carrier posture change mechanism 30.

The support shaft 33 is connected to a rotary drive mechanism (not shown) which has a lock mechanism for preventing rotation and a return mechanism. The driving system of the lock mechanism and the return mechanism is connected to that of the air cylinder 32 of clamps 31a and 31b via an automatic control circuit so as to cooperate therewith.

As shown in FIG. 6A, when the clamps 31a and 31b open, the lock mechanism operates to cause the movable base 30a to be held horizontally by the support shaft 30.

On the other hand, when the clamps 31a and 31b are closed as shown in FIG. 6B, the lock mechanism is released and the support shaft 33 is rotated counter-clockwise to cause the movable base 30a to take a vertical state.

After the clamps 31a and 31b have opened again as shown in FIG. 6C, the return mechanism operates to cause the support shaft 33 to rotate reversely so that the movable base 30a returns to the horizontal state.

A rotary roller 34 is provided right under the movable base 30a. The roller 34 is supported by a moving mechanism and is moved thereby so as to abut against the end faces of the wafer W exposed at the bottom of the carrier 7. The contact of the wafers W with the roller 34 allows the orientation flats of the wafers W in the carrier 7 to align with each other.

A wafer counter 35 is provided at the vicinity of the roller 34. The wafer counter 35 is also supported by the moving mechanism (not shown) and can be moved by it to a position close to a position right under the carriers 7. The wafer counter 35 has emitting/receiving photo sensors 38 and counts the number of wafers W by radiating the wafers W in the carrier 7 with light. An accuracy in an arrangement of the wafers, for example whether some of the wafers are omitted or not, is perceived by an output of the wafer counter 35.

The carrier transfer mechanism 11 will be explained with reference to FIGS. 7A and 7B.

The carrier transfer mechanism 11 and a wafer transfer mechanism 9 are formed unitarily. This unitary assembly assures a proper transfer of the wafers to be performed in a narrow space as shown in FIG. 9. This unitary assembly is therefor supported by a rotary shaft 134 so as to be rotatable therearound and to be lifted or lowered along the ball screw 16a in the directions along the Y axis as shown in FIG. 3.

The carrier transfer mechanism 11 has a pair of links 37a and 37b opposed to each other. They are in a mirror image relationship. Thus, only one link 37a is explained for convenience. A main member 48a is fixed to a side portion of the front face of a main body frame 47. A fixed arm 49a is attached to the front end of the main body 48a, and a cylinder 50a is fixed to a lateral wall of the main member 48a.

The cylinder 50a drives a movable arm comprising a short arm 52a, a long arm 53a, a first pawl member 54a, a second pawl member 55a and pins 56, and extending along the fixed arm 49a at its outside. One end of the short arm 52a is connected to the forward end of the rod 51a of the cylinder 50a by means of a pin 56, and one end of the long arm 43a is connected to the other end of the short arm 52a by means of another pin 56. The first pawl member 54a is connected to the forward end of the long arm 53a by means of a further pin 56, and the second pawl member 55a is connected to the long arm 53a at the vicinity of its rear end by means of a still further pin 56. The other ends of the first and second pawl members 54a and 55a are connected to the appropriate portions of the fixed arm 49a by means of other pins 56.

It should be understood that the elements having reference numerals bearing a of the link 37a are replaced by the elements having the same reference numerals bearing b when the reference will be made to the link 37b.

Figure 7A:
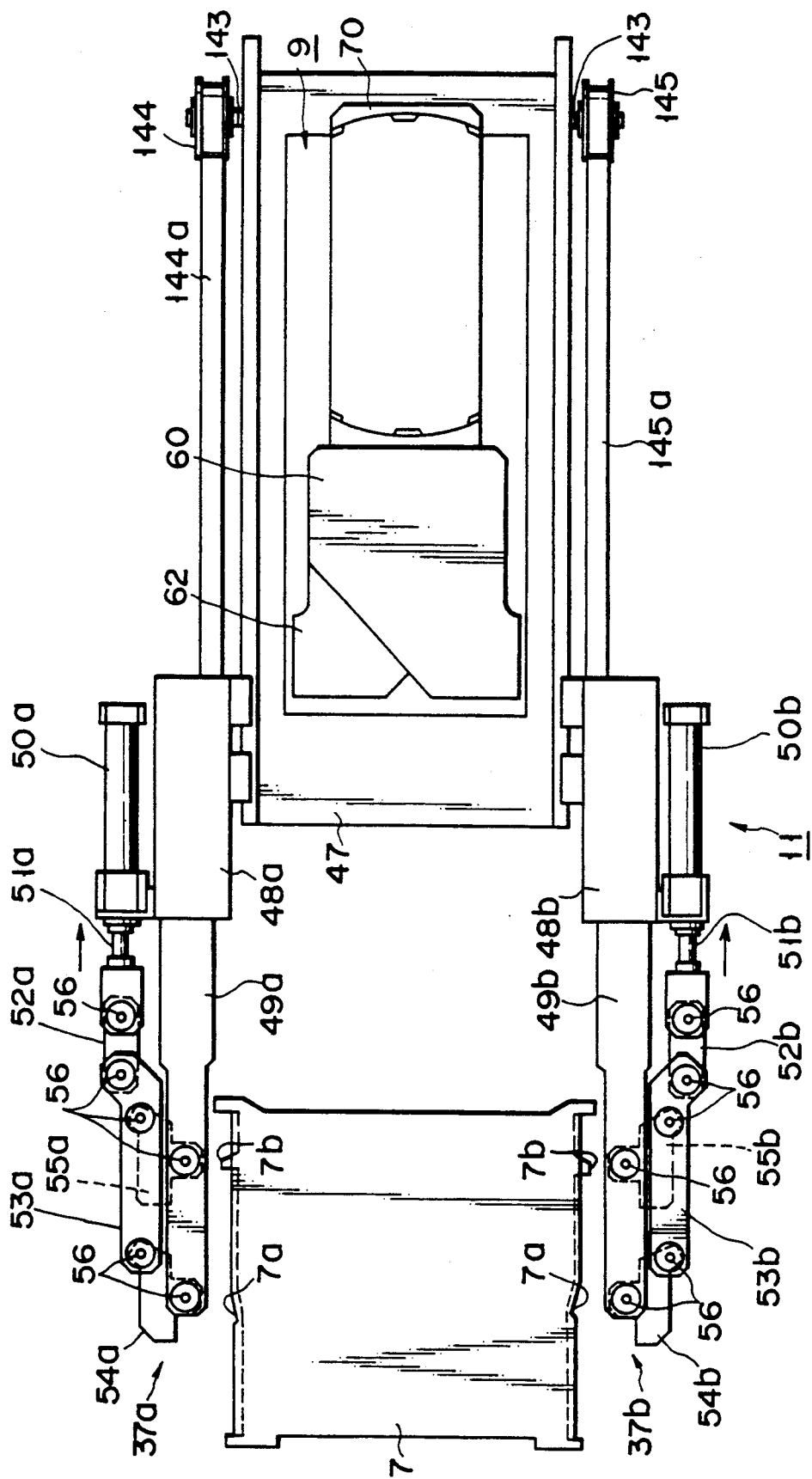
FIG. 7A is a plan view of the carrier receiving mechanism when it does not holds a carrier.
Figure 7B:
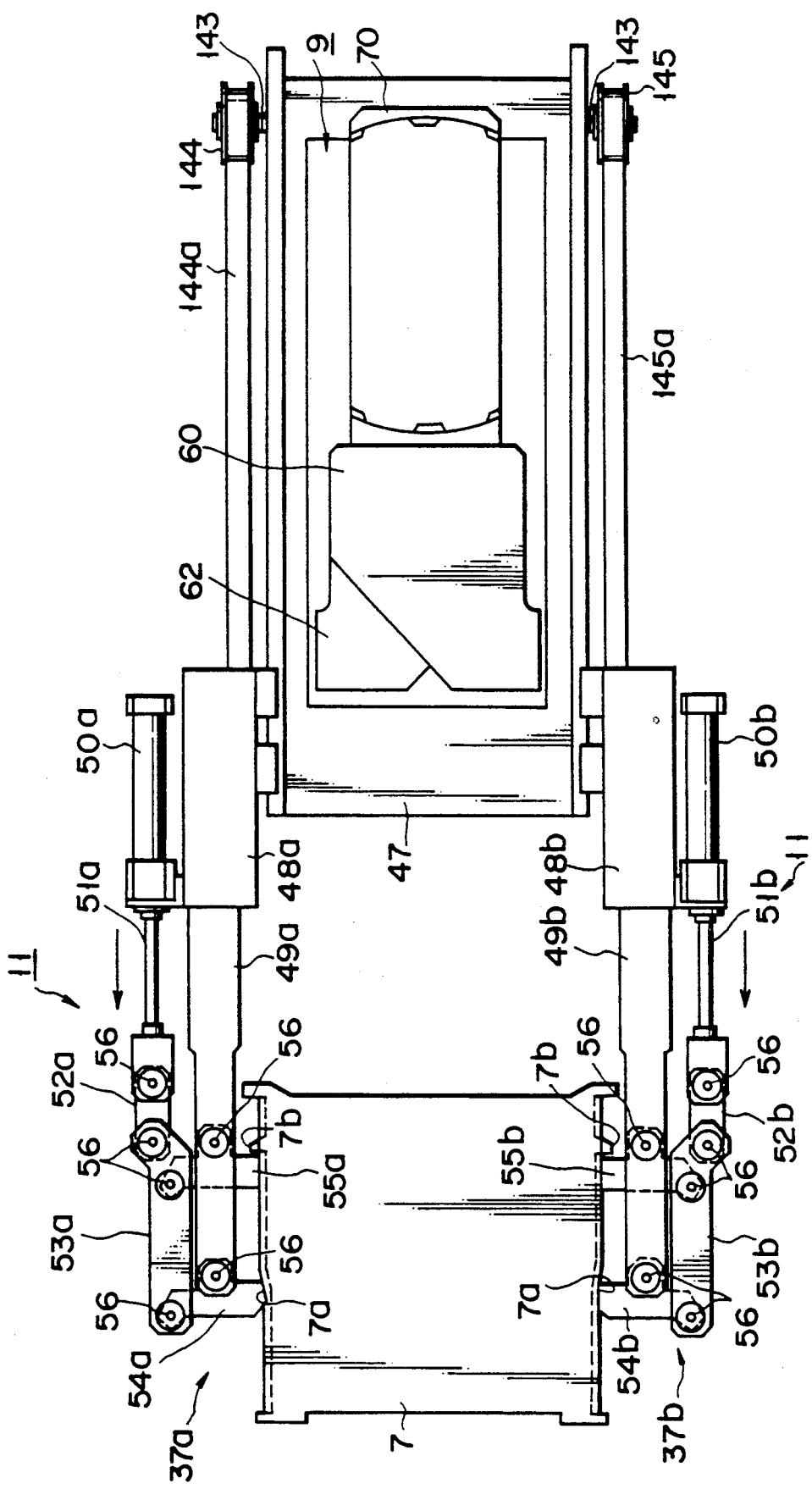
FIG. 7B is a plan view of the carrier receiving mechanism when it holds a carrier.

When the link 37a which is constructed as above-mentioned is retracted in the cylinder 50a, the forward ends of the first and second pawl members 54a and 55a are directed in the lengthwise direction of the fixed arm 49a, as shown in FIG. 7A.

On the other hand, when the rod 51a is extended from the cylinder 50a, the forward ends of the first and second pawl members 54a and 55a are rotated so that they are directed towards the direction perpendicular to the lengthwise direction of the fixed arm 49a. The carrier 7 is formed with a depression 7a and a stop 7b at its side wall. The relative position between the carrier 7 and the carrier transfer mechanism 11 is adjusted by matching first pawl member 54a and the second pawl member 55a to the depression 7a and the stop 7b, respectively.

Referring to FIGS. 8 to 11, the wafer transfer mechanism 9 will now be explained in detail.

Two kinds of forks consisting of a set of five forks 70a to 70e and a fork 70f and made of aluminum alloy are provided on the frame 47 of the wafer transfer mechanism 9 and are supported by support members 60 and 62, respectively, so that they are driven separately by means of belt driving mechanisms 121 and 128, respectively. The forks 70a to 70f may be made of alumina, SiC or quartz instead of aluminum alloy.

As shown in FIG. 8, the driving mechanism 121 for the set of five forks 70a to 70e comprises a timing belt 123 stretched between a pair of pulleys 124, a motor 122 connected to one of the pulleys 124 and an idler wheel 125. The other belt driving mechanism 128 has the similar structure to the belt driving mechanism 121. The motor 122, and the driving mechanism 121 and 128 are housed in the frame 47 to prevent generating dust from being scattered.

In FIG. 9, the frame 131 of the swivel mechanism 130 is mounted on the bottom of the frame 45 via bearings 135. A step motor is used as a motor 133 of the swivel mechanism 130 and the rotation of the shaft 134 of the motor 133 is automatically controlled by a program of the computer system.

The carrier transfer mechanism 11 is moved by an X axis driving mechanism 141 of a belt driving type in the directions of the X axis. The motor 142 of the X axis driving mechanism 141 is fixed to the frame 47, and a motor driving shaft 143 is connected to pulleys 144 and 145.

Figure 10:
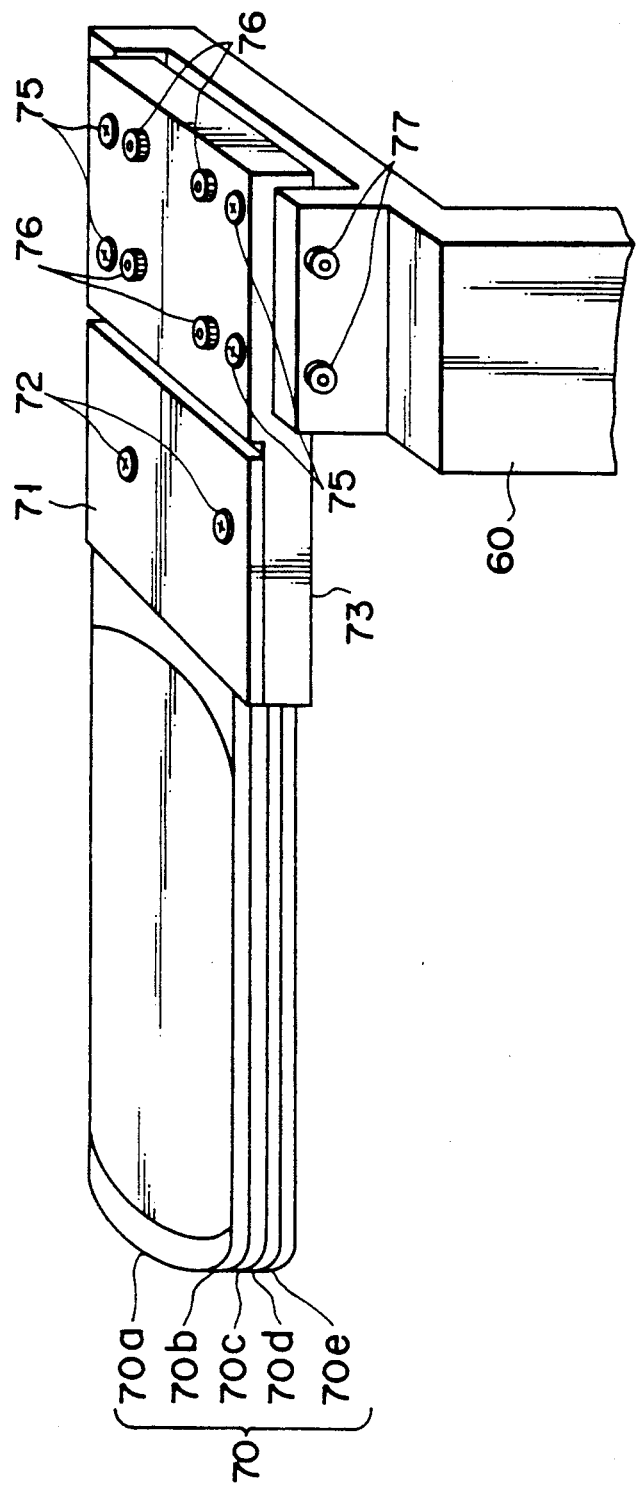
FIG. 10 is a perspective view of the forks of the wafer loading/unloading mechanism.
Figure 11:
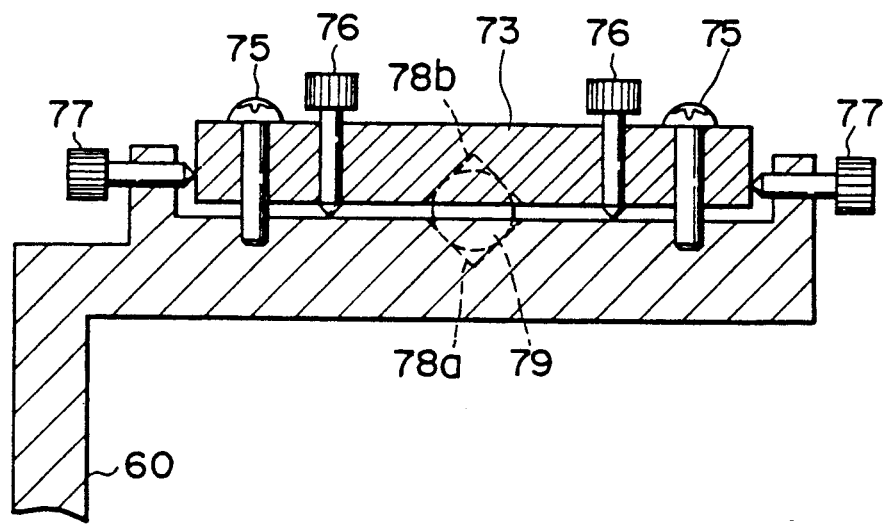
FIG. 11 is a transversal cross-sectional view of the wafer loading/unloading mechanism.

As shown in FIGS. 10 and 11, the set of five forks 70a to 70e of the wafer transfer mechanism 9 are placed between a base 73 and a plate 71 and fixed by screws 72 so as to be arranged at equal intervals. A ball 79 is placed in depressions 78a and 78b formed in the opposed faces of the support member 60 and the base 73, and the position of the base 73 as well as the positions of the forks 70a to 70e can be changed by means of first and second adjustment screws 76 and 77. Specifically, the horizontal and vertical positions of the tips of the forks 70a to 70e are adjusted by means of the four first adjustment screws 76, and the rotational position of the of the forks 70a to 70e is adjusted by means of the four second adjustment screws 77. Fixing screws 75 fix the base 73 to the support member 60.

A boat transfer mechanism 6 will be described in detail with reference to FIGS. 12 and 13.

The boat transfer mechanism 6 includes a rotary shaft member 20, an arm 19 supported by the rotary shaft member 20 and a support portion 21 formed at the front end of the arm 19 and shaped like a semi-circle. The rotary shaft member 20 rotates the arm 19 through rotating system and moves it up and down through a lift system.

The arm 19 is rotated from a home position H which is adjacent to a boat waiting system 90 to a wafer transfer position R where wafers are received from the wafer transfer mechanism 9, and vice versa by means of the rotating system of the rotary shaft member 20. The wafer transfer position R is on a straight line passing through the center of the cassettes carried to the I/0 stage, the center Q of rotation of the wafer transfer apparatus and the axial center of the reaction tube 2. When the rotary shaft member 20 is moved up and down, the boat B can be loaded onto and unloaded from each of its mounting stands at the positions H, S and R.

When the boat B is to be supported by the support portion 21 of the arm 19 which is provided with a U-shaped receiving recess 22, the following three positionings must be carried out.

First of all, the center of the boat B at the wafer transfer position R must be positioned at the center of the moving direction of the wafer transfer forks 70a-70e. Three chips 21a made of quartz and intended to contact the side of the boat B are arranged along the U-shaped recess 22 of the support portion 21 for this purpose. The chips 21a contact the side of the lower cylindrical portion b1 of the boat B received in the U-shaped recess 22 of the support portion 21 (see FIG. 14) to align the center of the boat B with the center of the support portion 21.

The direction of wafer carrying grooves b2 of the boat B at the wafer transfer position R must be then positioned to align with the moving direction of the wafer transfer forks 70a-70e. The support portion 21 is provided with plural or two positioning pins 21b for this purpose. The pins 21b at the home position H, for example, contact the flat peripheral portion of a lower flange b3 of the boat B received in the U-shaped recess 22 of the support portion 21 (see FIG. 14) to determine the direction of the wafer housing grooves b2 of the boat B. This direction is aligned with the moving direction of the wafer transfer forks 70a-70e when the boat B is carried to the wafer transfer position R.

Positioning must be further carried out not to tilt the wafer carrying grooves b2 of the boat B at the wafer transfer position R relative to wafer support planes of the wafer transfer forks 70a-70e. Three chips 21c made of quartz are arranged for this purpose along the U-shaped recess 22 of the support at a same interval to support the underside of the lower flange b3 of the boat B (see FIG. 14). The chips 21c are provided with adjuster systems to adjust the verticality of the boat B.

Each of the chips 21c is provided with a screw hole passing through the support portion 21. A screw is screwed into the screw hole and the chip 21c made of quartz is fixed to the top of the screw. When the screws are turned, therefore, the verticality of the boat B can be adjusted.

The boat waiting system 90 is located adjacent to the home position H of the arm 19, as shown in FIG. 3. The boat waiting system 90 is provided with a table 92 which receives the lower portion of the boat B to hold it vertical and which can be moved along a track 94 by a drive system (not shown).

As shown in FIGS. 3 and 14, another table 24 which receives the lower portion of the boat B to hold it vertical is located at the wafer transfer position R. This table 24 can be moved up and down.

Also located at the wafer transfer position R is support system 26 which holds the top of the boat B at the wafer transfer time, as shown in FIG. 14. The support system 26 includes an engaging member 27 made of quartz and shaped like a truncate cone. This engaging member 27 is moved up and down by a system which will be described below and engaged with a hole or recess of a ring-shaped projection b4 on the top of the boat B.

As shown in FIG. 15, the support system 26 includes a cylinder 262 and a stroke linear bearing 266 which are fixed to a beam 261. A movable shaft 263 of the cylinder 262 extends upward, passing through the beam 261, and connected to a link 264. A shaft 265 also extends, passing through the beam 261 and the bearing 266, and the shaft 265 is connected at the top thereof to the link 264. In short, the cylinder shaft 263 and the shaft 265 are commonly connected to the link 264. A flange 268 is attached to the lower end of the shaft 265 and the engaging member 27 is attached to the flange 268.

The shaft 265 is provided with a metal bellows 267 between the lower end of the bearing 266 and the flange 268. The bellows 267 is intended to prevent dust which is caused at the operation time of the shaft 265 from falling onto the boat B located under the support system 26.

As shown in FIG. 16, the engaging member 27 made of quartz and shaped like a truncate cone comprises flange 271 and a truncate cone portion 272 made integral to each other. A counter bore 273 and a screw hole 274 are formed passing through these flange 271 and truncate cone portion 272 along their axial center. The screw hole 274 is aligned with a screw hole 269 formed in the lower end of the shaft 265. A metal screw 275 is screwed into the screw holes 274 and 269 and the engaging member 27 is thus fixed to the flange 268 at the lower end of the shaft 265. The head of the screw 275 is completely embedded this time in the bore 273 to thereby contact only the quartz portion of the engaging member 27 with the projection b4 of the boat B.

It will be now described how the wafers W are treated by the above-described apparatus.

The carriers 7 are successively mounted on the boat 10 by the robot. Wafer transferring and heat-treating requisites are inputted to the CPU of the computer system by the keyboard. There are carried 25 sheets of the semiconductor wafers W at maximum in the carrier 7.

Command signal is sent from the CPU to the parallel transfer mechanism 80 and the mechanism 80 is thus rendered operative. As shown in FIGS. 5A-5D, the carrier 7 is grasped by the paired arm 82 of the parallel transfer mechanism 80 and mounted on the movable base 30a.

The carrier 7 is held by the arms 31a and 31b of the carrier posture change mechanism 30. Since the arm 31a has a stronger locking force than the arm 31b, the arm 31a is set in position with respect to the carrier 7 before the arm 31b is set. Then, the roller 34 is caused to contact the wafers W in the carrier 7 to align the orientation flats of wafers. Next, the number of the wafers W in the carrier 7 is counted by the wafer counter 35. After unlocking, the shaft 33 is rotated counterclockwise to rotate the carrier 7 as well as movable base 30a through 90 degrees. As shown in FIG. 6B, the wafers W in the carrier 7 take a horizontal position.

The carrier transfer mechanism 11 is advanced towards the carrier 7, and the links 37a and 37b are positioned at the sides of the carrier 7. Thereafter, the rods 51a and 51b are projected from the cylinders 50a and 50b. The tips of the second pawl members 55a and 55b contact the stops 7b of the carrier 7 and the carrier transfer mechanisms 11 and the carrier 7 are set in position. As shown in FIG. 7B, the tips of the first pawl members 54a and 54b are fitted in the depressions 7a of the carrier 7, whereby the carrier 7 is held by the links 37a and 37b.

After the arms 31b of the carrier posture change mechanism 30 are unlocked, the arms 31a are also unlocked. Then, the carrier transfer mechanism 11 is retracted in the wafer transfer section 1b and is rotated to the carrier station 8. Then, the mechanism 11 is elevated to position the carrier 7. The rods 51a and 51b are retracted in the cylinders 50a and 50b, and then the links 37a and 37b are unlocked. The carrier 7 is loaded on the carrier station 8.

With this embodiment, the carrier station 8 has four stories, each of which has two compartments. Each compartment of the carrier station 8 is provided with a sensor (not shown) for detecting the carrier 7. The compartments of the carrier station 8 in which the carriers 7 are received are previously programmed. While the wafers W are not transferred from carriers to the boat B, the carriers on the port 10 are transferred to the carrier station 8 in succession.

The boat B enters the wafer transfer section 1b through an inlet (not shown) and is set at a predetermined waiting position.

By actuating the swivel mechanism 130, the carrier transfer mechanism 11 and the wafer transfer mechanism 9 are replaced from each other, and the forks 70a to 70e are caused to face the openings of the carrier 7. By the drive of the belt, the forks 70a to 70e are advanced, and, after the tips of the forks have been inserted in the carrier 7, the forks 70a to 70e stop at predetermined position. The forks 70a to 70e are raised a little and pick up five wafers W in the carrier 7.

The forks 70a to 70e are retracted and rotated to face the boat B. The fork 70a to 70b are advanced again to insert the wafers W in the boat B and are lowered. By doing so, the five wafers W are transferred from the forks 70a to 70e to the boat B.

When this transfer of the wafers W into the boat B is carried out, the boat B is held vertical on the table 24 which is located at the wafer transfer position R. When the table 24 is lifted or the engaging member 27 is lowered, the engaging member 27 is engaged with the hole in the projection b4 on the top of the boat B and the top of the boat B is thus fixedly held. The wafers W are transferred into the boat B while holding the boat B under this state.

After this wafer transfer process, the table 24 is lowered or the engaging member 27 is lifted and the boat B is thus released from its fixed state. The arm 19 of the boat transfer system 9 is swung to hold the lower portion of the boat B. As shown in FIG. 14, the arm 19 is lifted or the table 24 is lowered to release the boat B from the table 24.

The arm 19 is then swung to carry the boat B onto the table 92 of the boat waiting system 90. The arm 19 is lowered and the boat B is thus mounted on the table 92. The table 92 is moved along the track 94 and the boat B is thus released from the arm 19.

Another boat B which is different from the above-mentioned one and to which heat treatment has been applied in the reaction tube 2 is lowered by the lift system 16. As shown in FIG. 14, the arm 19 is swung to hold the lower portion of the boat B disposed on the heat insulating cylindrical member 18 on the support member of the lift system 16. The arm 19 is lifted or the support member 5 is lowered and the boat B is thus transferred from the heat insulating cylindrical member 18 to the arm 19.

The boat B is carried to the wafer transfer position R by the swinging arm 19 and mounted on the table 24 as described above. The wafers which have been heat-treated are transferred from the boat B to the carriers 7 on the carrier stations 8 by the transfer system 9 in a process reverse to the above-described one intended to transfer the wafers from the carriers to the boat B.

While the heat-treated wafers are being transferred from the boat B to the carriers 7, the arm 19 is swung to the home position H or above the boat waiting system 90. The waiting boat B on which not-treated wafers W have been mounted is carried by the table 92. The lower portion of this boat B is fitted into the support portion 21 of the arm 19 which is located at the home position H. The arm 19 is lifted and the boat B is thus released from the table 92.

The arm 19 is then swung to carry the boat B on which the not-treated wafers have been mounted to the axial center of the reaction tube 2 or onto the support member 5 of the lift system 16. The arm 19 is lowered or the support member 5 is lifted while keeping the axial center of the boat B aligned with that of the heat insulating cylindrical member 18 and the boat B is thus transferred onto the heat insulating cylindrical member 18. The arm 19 is then retreated to the home position H.

The support member 5 of the lift system 16 lifts until the lid member 15 closes the reaction tube 2, and the boat B is thus held or loaded in the reaction tube 2. The heat treatment is then carried out, controlling the temperature in the reaction tube 2 by the heater 12 and introducing treatment gas into the reaction tube 2.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of loading a wafer boat supporting wafers into and unloading the same from a reaction tube with a lid therebelow in a vertical heat treatment apparatus, while holding the wafer boat vertical with respect to the lid, said method comprising the steps of:

providing boat transfer means in a space below the reaction tube, said boat transfer means being designed to transfer wafer boats along a path, while holding the wafer boats vertical and in a substantially horizontal plane;

forming, along the path, a first station where wafers are to be placed onto and removed from the wafer boats held vertical, a second station where wafer boats are to be placed onto and removed from the lid, and a third station where wafer boats are to held;

mounting unprocessed wafers on a first wafer boat located at the first station, while wafers mounted on a second wafer boat is being heat-treated in said reaction tube;

transferring the first wafer boat from the first station to the third station by means of the boat transfer means, and then holding the first wafer boat at the third station;

lowering the second wafer boat to the second station to unload the second wafer boat from the reaction tube, while the first wafer boat is held at the third station, and then transferring the second wafer boat to the first station by means of the boat transfer means;

removing the heat-treated wafers from the second wafer boat located at the first station; and transferring the first wafer boat from the third station to the second station by means of the boat transfer means, while the second wafer boat is located at the first station, and then mounting the first wafer boat onto the lid, thereby to load the first wafer boat into the reaction tube.

2. The method according to claim 1, further comprising the step of transferring the first wafer boat, which is vacant, from the third station to the first station by means of the boat transfer means, while the wafers placed on the second wafer boat are being heattreated in the reaction tube.

3. The method according to claim 1, further comprising the step of placing unprocessed wafers on the second wafer boat, after the processed wafers have been removed from the second wafer boat, while the second wafer boat being unmoved at the first station.

4. The method according to claim 1, further comprising the step of transferring the second wafer boat supporting unprocessed wafers, from the first station to the third station by means of the boat transfer means, after the first wafer boat has been loaded into the reaction tube, and then holding the second wafer boat at the third station.

5. The method according to claim 1, wherein top portion of each wafer boat is held, while wafers are being placed onto and removed from the wafer boat located at the first station.

6. The method according to claim 1, wherein a plurality of wafers are simultaneously placed onto or removed from each wafer boat located at the first station.

7. The method according to claim 1, wherein each wafer boat transferred to the third station by means of the boat transfer means is turned aside from said path, and then is held at the third station.

* * * * *

UNITED STATES PATENT AND TRADEMARK OFFICE
CERTIFICATE OF CORRECTION

PATENT NO. : 5,055,036
DATED : October 8, 1991
INVENTOR(S) : Takanobu Asano et al.

It is certified that error appears in the above-identified patent and that said Letters Patent is hereby corrected as shown below:

On Title Page item [30]
The Foreign Application Priority Data has been omitted, should be, --February 26, 1990 [JP] Japan................2-45212--.

Signed and Sealed this

Ninth Day of March, 1993

Attest:

STEPHEN G. KUNIN

*Attesting Officer*   *Acting Commissioner of Patents and Trademarks*